(12) United States Patent
Lin

(10) Patent No.: US 7,174,144 B2
(45) Date of Patent: Feb. 6, 2007

(54) CALIBRATION OF A PHASE LOCKED LOOP

(75) Inventor: Tsung-Hsien Lin, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 894 days.

(21) Appl. No.: 10/243,854

(22) Filed: Sep. 13, 2002

(65) Prior Publication Data

US 2004/0053591 A1 Mar. 18, 2004

(51) Int. Cl.
*H04B 1/06* (2006.01)
(52) U.S. Cl. ...................... 455/258; 455/260; 455/313; 455/84
(58) Field of Classification Search ................ 455/258, 455/259, 260, 264, 84, 255, 313, 323, 76, 455/318, 317; 327/156, 157; 331/16, 17
See application file for complete search history.

(56) References Cited

U.S. PATENT DOCUMENTS 5,382,922 A * 1/1995 Gersbach et al. ............. 331/16
6,078,634 A * 6/2000 Bosshart ....................... 331/10
6,608,511 B1 * 8/2003 Hsu ............................ 327/157
7,120,412 B2 * 10/2006 Anand ......................... 455/260
2003/0117189 A1 * 6/2003 Beghein ...................... 327/156
2003/0119467 A1 * 6/2003 Welland et al. ............. 455/260
2003/0232610 A1 * 12/2003 Lin et al. .................... 455/258
2006/0139105 A1 * 6/2006 Maxim et al. .............. 455/258

* cited by examiner

*Primary Examiner*—Lana Le
(74) *Attorney, Agent, or Firm*—Garlick Harrison & Markison; Timothy W. Markison

(57) ABSTRACT

Calibration of a phase locked loop and applications thereof within a radio frequency integrated circuit begins by determining an intersection of an up current and down current produced by a charge pump within the phase locked loop. The RFIC then determines a reference voltage corresponding to the intersection, which varies from an ideal voltage of $V_{DD}/2$ based on process variations. The RFIC then offsets a control voltage to the voltage control oscillator (VCO) of the phase locked loop based on the reference voltage. Accordingly, by determining the offset of the actual intersection from the ideal intersection, the control voltage to the VCO may be adjusted thereby calibrating the phase locked loop for more linear performance.

16 Claims, 6 Drawing Sheets local oscillation module 74 ideal current relationship calibration mode actual current relationship

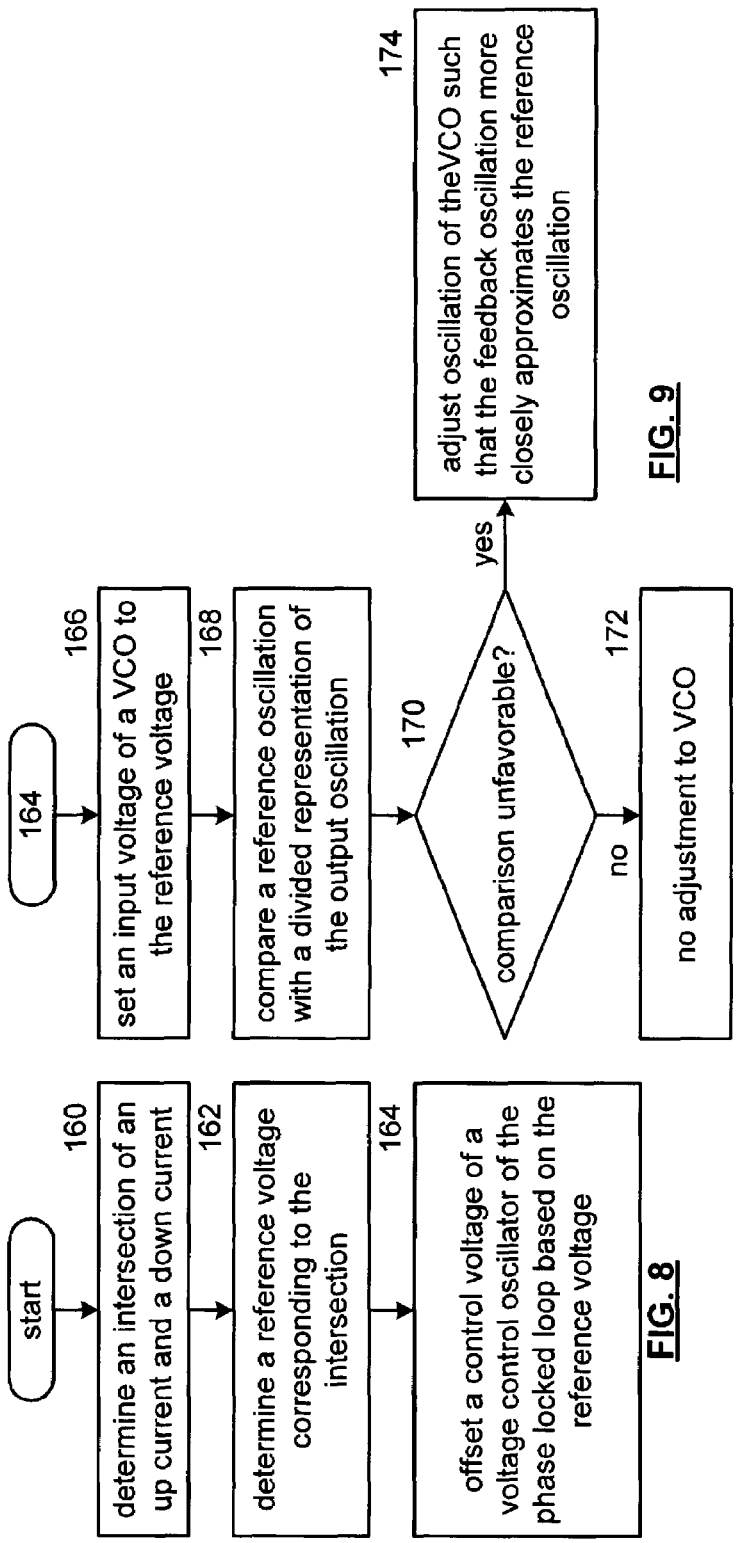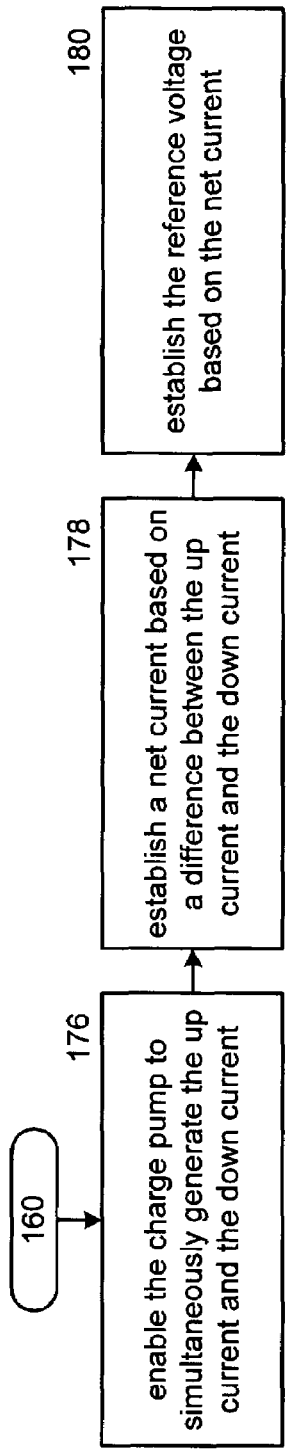

CALIBRATION OF A PHASE LOCKED LOOP

BACKGROUND OF THE INVENTION

1. Technical Field of the Invention

This invention relates generally to wireless communication systems and more particularly to radio frequency integrated circuits used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. The filtering stage filters the baseband signal or the IF signal to attenuate unwanted out of band signals to produce a filtered signal. The data recovery stage recovers raw data from the filtered signal in accordance with the particular wireless communication standard.

The local oscillations used in the transmitter and the receiver may be produced by the same or different local oscillation generators. In either case, a local oscillator generator is typically implemented using a fractional N-synthesizer or an integer N-synthesizer. As is known, a fractional, or integer, N-synthesizer has a phase lock loop (PLL) topology that allows for fractional adjustments of the feedback oscillation via a feedback fractional, or integer, N divider. As is also known, the fractional adjustments of the fractional, or integer, N divider, allow for fine tuning of the local oscillation such that, for example, a particular channel may be tuned, a particular intermediate frequency may be achieved, et cetera.

While a fractional, or integer, N-synthesizer allows for fine-tuning of a local oscillation, its accuracy is limited by the linearity of the components comprising the fractional N-synthesizer. As is known, the fractional, or integer, N-synthesizer includes a phase/frequency detector, a charge pump, a low pass filter, a voltage controlled oscillator, and a fractional, or integer, N divider. In most fractional, or integer, N-synthesizers, the charge pump is a tri-state device providing a positive current when the output oscillation is too low, a negative current when the output oscillation is too high and zero current at all other times. To produce the zero current state, the charge pump activates, or disables, its two current sources to provide equal, but opposite, currents to the low pass filter. In an ideal environment, the positive current exactly matches the negative current. In practice, however, the currents produced by each current source of the charge pump are not identical due to integrated circuit manufacturing process variations, temperature variations, etc.

The difference in currents results in an instantaneous non-net zero current being provided to the low pass filter, which results in unwanted spurs in the output oscillation and causes non-linear performance of the local oscillator. To combat this problem, IC designers use matched components to create the current sources of the charge pump. While this mitigates the problem, it does not reduce it sufficiently enough for today's high performance radio frequency integrated circuit applications and other advanced technology applications.

Therefore, a need exists for highly linear phase locked loop for use in radio frequency integrated circuit applications and other advanced technology applications.

SUMMARY OF THE INVENTION

The calibration of a phase locked loop and applications thereof within a radio frequency integrated circuit thereof of the present invention substantially meet these needs and others. In one embodiment, the RFIC calibrates a phase locked loop, which may constitute at least a portion of a local oscillator within the RFIC, by determining an intersection of an up current and down current produced by a charge pump within the phase locked loop. The RFIC then determines a reference voltage corresponding to the intersection, which varies from an ideal voltage of $V_{DD}/2$ based on process variations. The RFIC then offsets a control voltage to the voltage control oscillator (VCO) of the phase locked loop based on the reference voltage. Accordingly, by determining the offset of the actual intersection from the ideal intersection, the control voltage to the VCO may be adjusted thereby calibrating the phase locked loop to substantially eliminate unwanted reference spurs.

In another embodiment, the radio frequency integrated circuit includes a transmitter section, receiver section, and local oscillation module. The local oscillation module generates a transmit local oscillation, which is used by the transmitter section, and a receiver local oscillation, which is used by the receiver section. The local oscillation module includes a phase and frequency detection module, a charge pump, a loop filter, a voltage control oscillator (VCO), a calibration module, and a divider module. The calibration module is operably coupled to provide a calibration voltage to the voltage control oscillator when the local oscillation module is in a calibration mode and to provide an adjusted control voltage to the VCO when the local oscillation is in normal mode. The calibration module includes a calibration voltage module and a voltage control oscillator adjust module. The calibration voltage module produces the calibration voltage based on an intersection of a positive current and negative current produced by the charge pump. The voltage control oscillator adjust module adjusts the control voltage provided to the VCO based on the calibration voltage to produce the adjusted control voltage.

BRIEF DESCRIPTION OF THE SEVERAL VIEWS OF THE DRAWINGS

FIGS. 8–10 are logic diagrams of a method for calibrating a phase locked loop in accordance with the present invention.

DETAILED DESCRIPTION OF THE INVENTION

Figure 1:
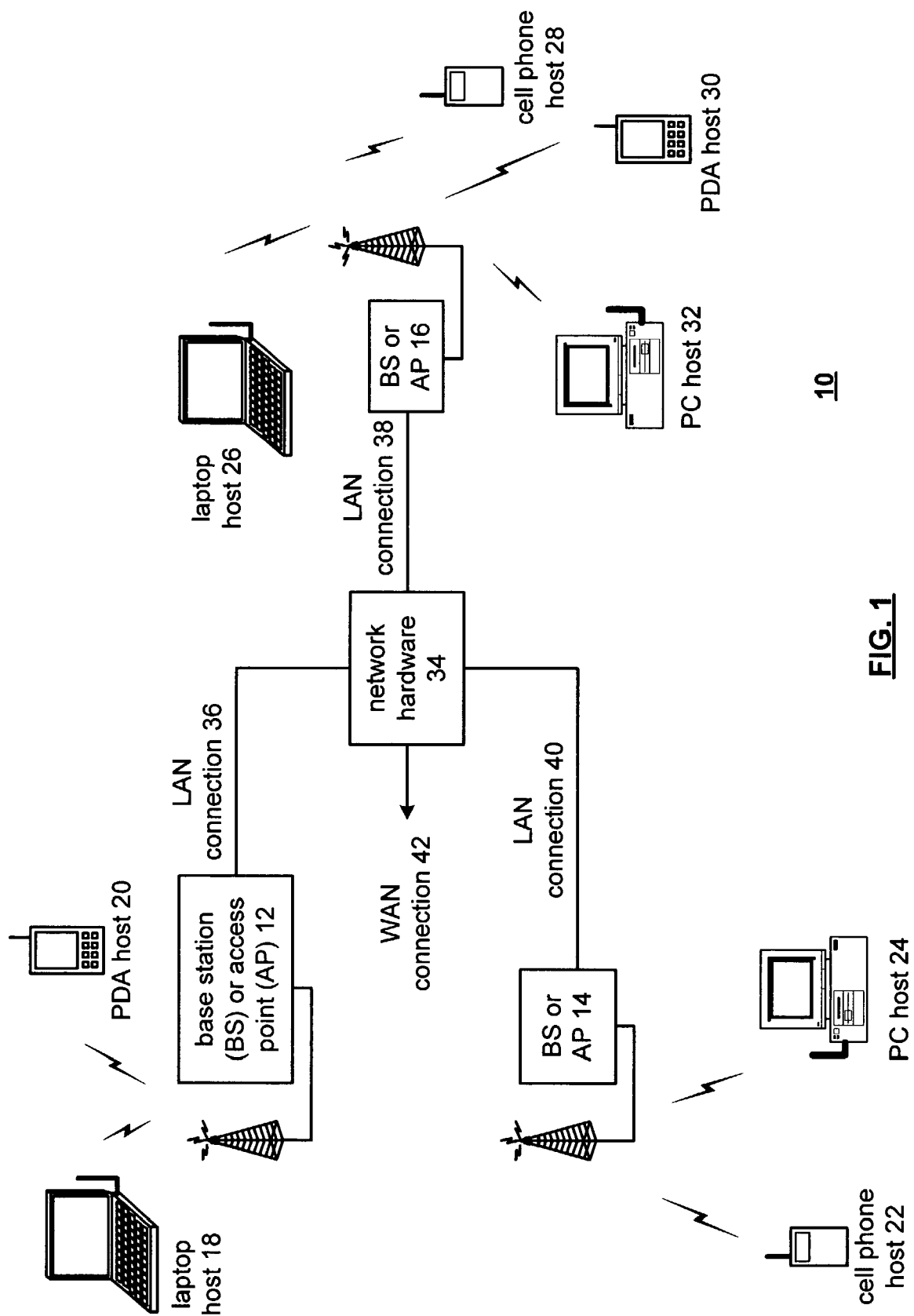
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
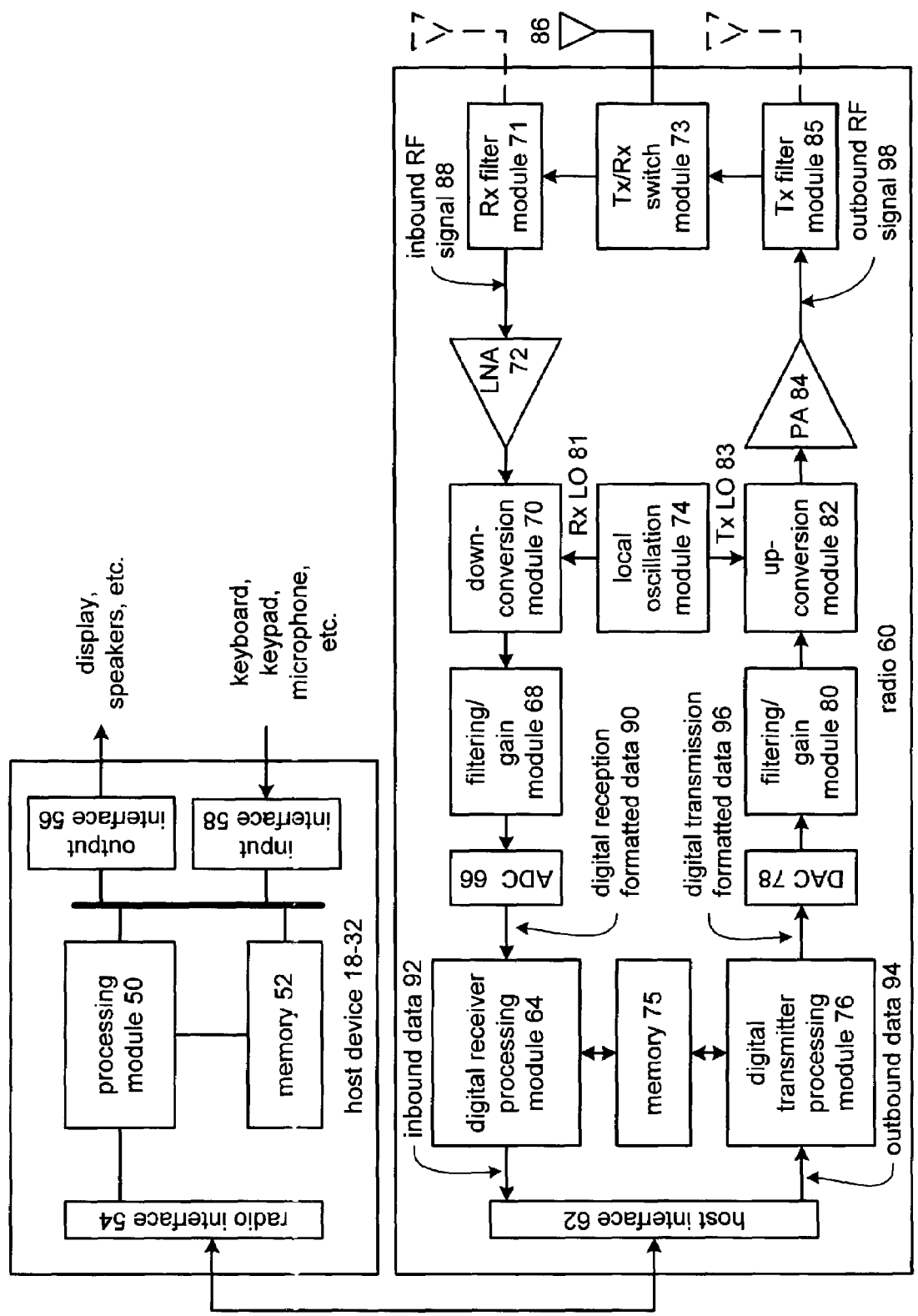
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
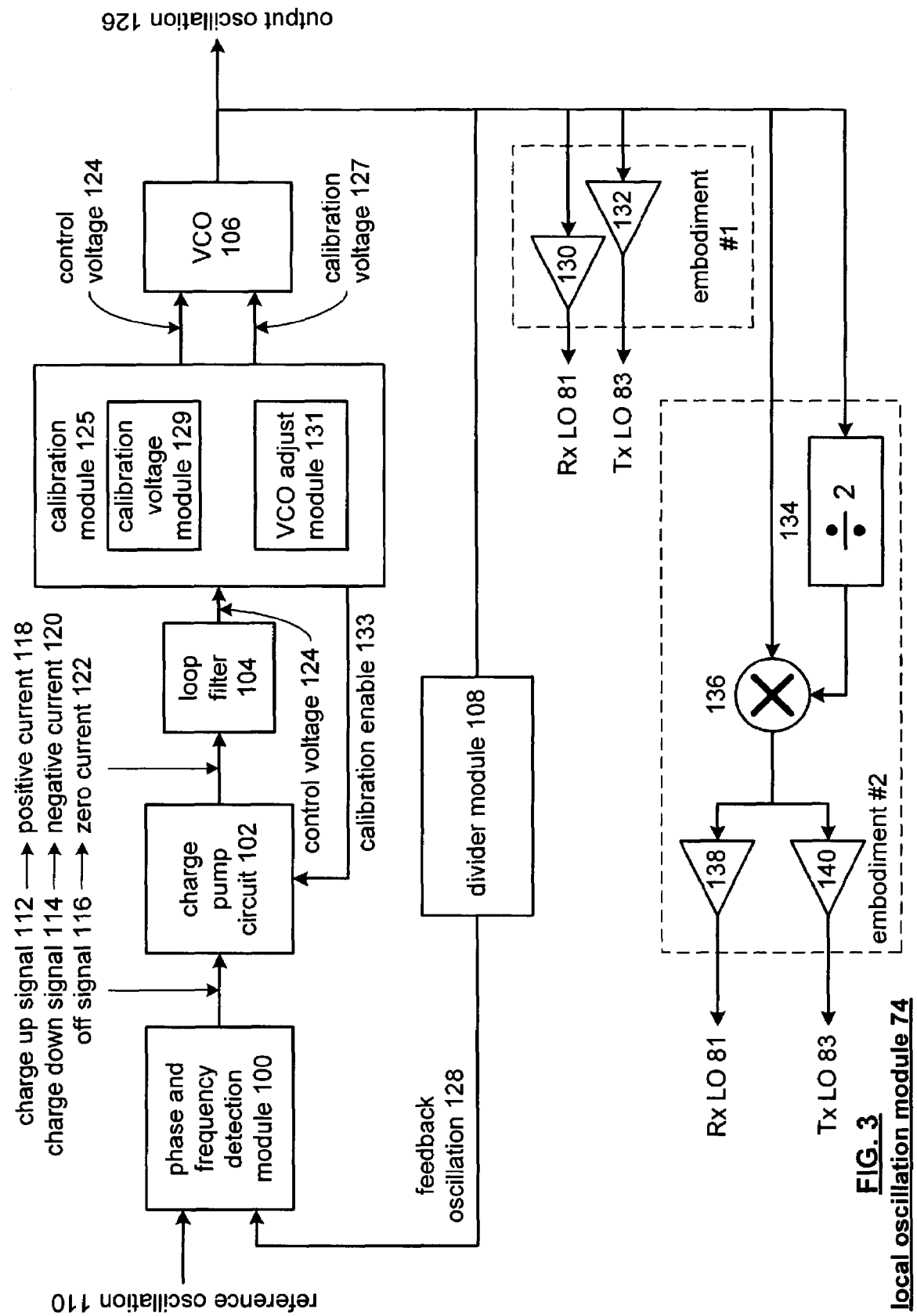
FIG. 3 is a schematic block diagram of a local oscillation module in accordance with the present invention.

FIG. 3 is a schematic block diagram of local oscillation module 74 that includes a phase and frequency detection module 100, a charge pump circuit 102, loop filter 104, calibration module 125, voltage control oscillator (VCO) 106, and a divider module 108. The phase and frequency detection module 100 produces a charge-up signal when the reference oscillation 110 leads the feedback oscillation 128. The phase and frequency detection module 100 produces a charge-down signal 114 when the reference oscillation 110 lags the feedback oscillation 128. At all other times, the phase and frequency detection module produces an off signal 116.

The charge pump 102 receives the charge-up signal 112, the charge-down signal 114 and off signal 116 and produces a positive current 118, and negative current 120 and zero current 122, respectively therefrom. The loop filter 104 receives the current produced by the charge pump 102 and produces therefrom a control voltage 124. In normal mode, the calibration module 125 passes the control voltage 124 or an adjusted representation thereof to the voltage control oscillator 106. Based on this input, the voltage control oscillator 106 generates an output oscillation 126.

The divider module 108 divides the output oscillation 126 by a divider value, which may be an integer or a whole number, to produce the feedback oscillation 128. The transmit and receive local oscillations 81 and 83 may be generated directly from the output oscillation 126 via buffers 130 and 132, as shown in a first embodiment. Alternatively, as shown in a second embodiment, the output oscillation may be divided by a divide by 2 module 134. The divided by 2 signal is then multiplied with the output oscillation 126 via multiplier 136. The resulting frequency is 1½ times the output oscillation, where the receiver local oscillation 81 and transmit local oscillation 83 are produced via buffers 138 and 140. As one of average skill in the art will appreciate, quadrature components of the receiver local oscillation 81 and transmitter local oscillation 83 may be derived by including a 90° phase shift module for each local oscillation produced.

The calibration module 125 includes a calibration voltage module 129 and a voltage control oscillator adjust module 131. The calibration module 125 may be incorporated in processing module 64 or processing module 76. To produce the calibrated control voltage 127, the calibration voltage module 129 generates a calibration voltage that is compared with the control voltage 124 produced when the charge pump 102 is simultaneously generating the positive current 118 and negative current 120. For an ideal current relationship, the positive current 118 exactly matches the negative current 120 such that the control voltage 124 will be ½ the supply voltage (e.g., ½ $V_{DD}$). If the positive current 118 is greater than the negative current 120, the control voltage 124 will be greater than ½ $V_{DD}$. Conversely, if the negative current 120 is greater than positive current 118, the control voltage 124 will be less than ½ $V_{DD}$.

The calibration voltage module 129 determines the offset of the control voltage 124 based on the measured voltage and the ideal voltage of ½ $V_{DD}$. Based on this determination, the VCO adjust module 131 adjusts the control voltage 124 to produce the calibrated control voltage 127, which is used during normal operation of the local oscillation module 74. The production of the calibrated control voltage 127 will be described in greater detail with reference to FIGS. 4–10.

Figure 4:
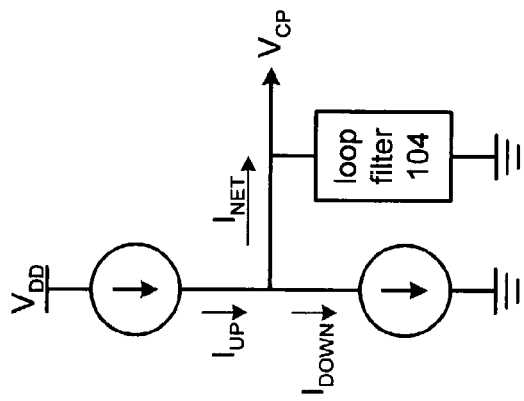
FIG. 4 is a schematic block diagram of a portion of the local oscillation module in calibration mode in accordance with the present invention.

FIG. 4 is a schematic block diagram of charge pump 102 and loop filter 104 during calibration mode. In calibration mode, the up-current source and down-current source of charge pump 102 are simultaneously active. As such, the up-current source is producing an up current ($I_{UP}$) and the down current source is sinking a down current ($I_{DOWN}$)

Figure 5:
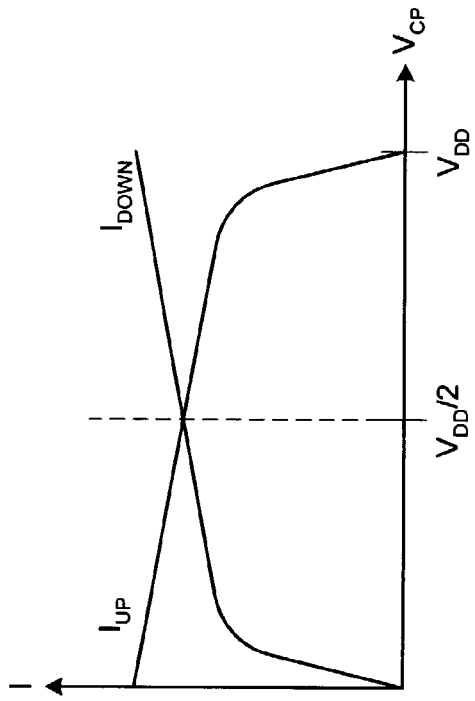
FIG. 5 is a graph plotting current versus control voltage in accordance with the present invention.

The ideal situation of the up current and down current is illustrated in FIG. 5. As shown in FIG. 5, with the up current and down current being equal, the intersection of the up and down current occurs at ½ $V_{DD}$, which reduces production of unwanted reference spurs of the phase locked loop when the PLL is locked at ½ $V_{DD}$.

Figure 6:
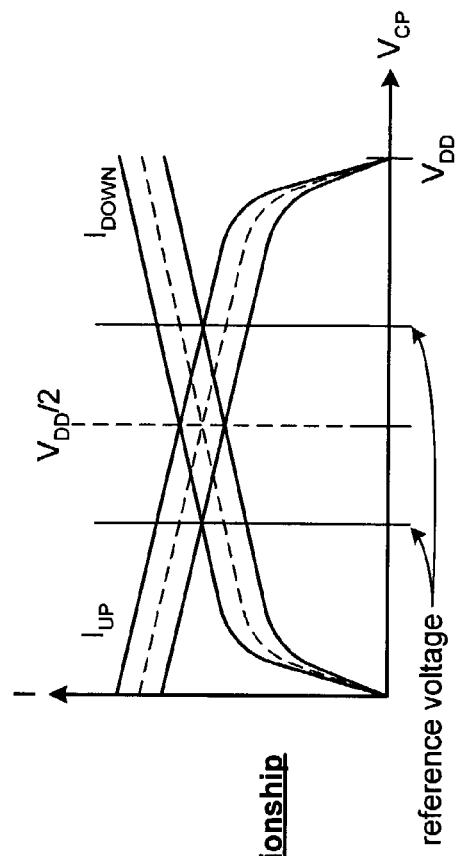
FIG. 6 is a graph of current versus control voltage having varying intersections based on process variations in accordance with the present invention.

FIG. 6 illustrates the up and down currents with respect to the output voltage $V_{CP}$ of the loop filter in actual radio frequency integrated circuits. The dash lines for the up current and down current represent the ideal situation. The solid lines represent the variations from ideal due to process variations and other errors associated with the manufacture of integrated circuits. As such, the reference voltage associated with the intersection may be more or less than ½ $V_{DD}$. By calibrating the phase locked loop to operate in steady state conditions at the intersection of the up current and down current, the overall performance of the phase locked loop is improved since the production of reference spurs is reduced.

Figure 7:
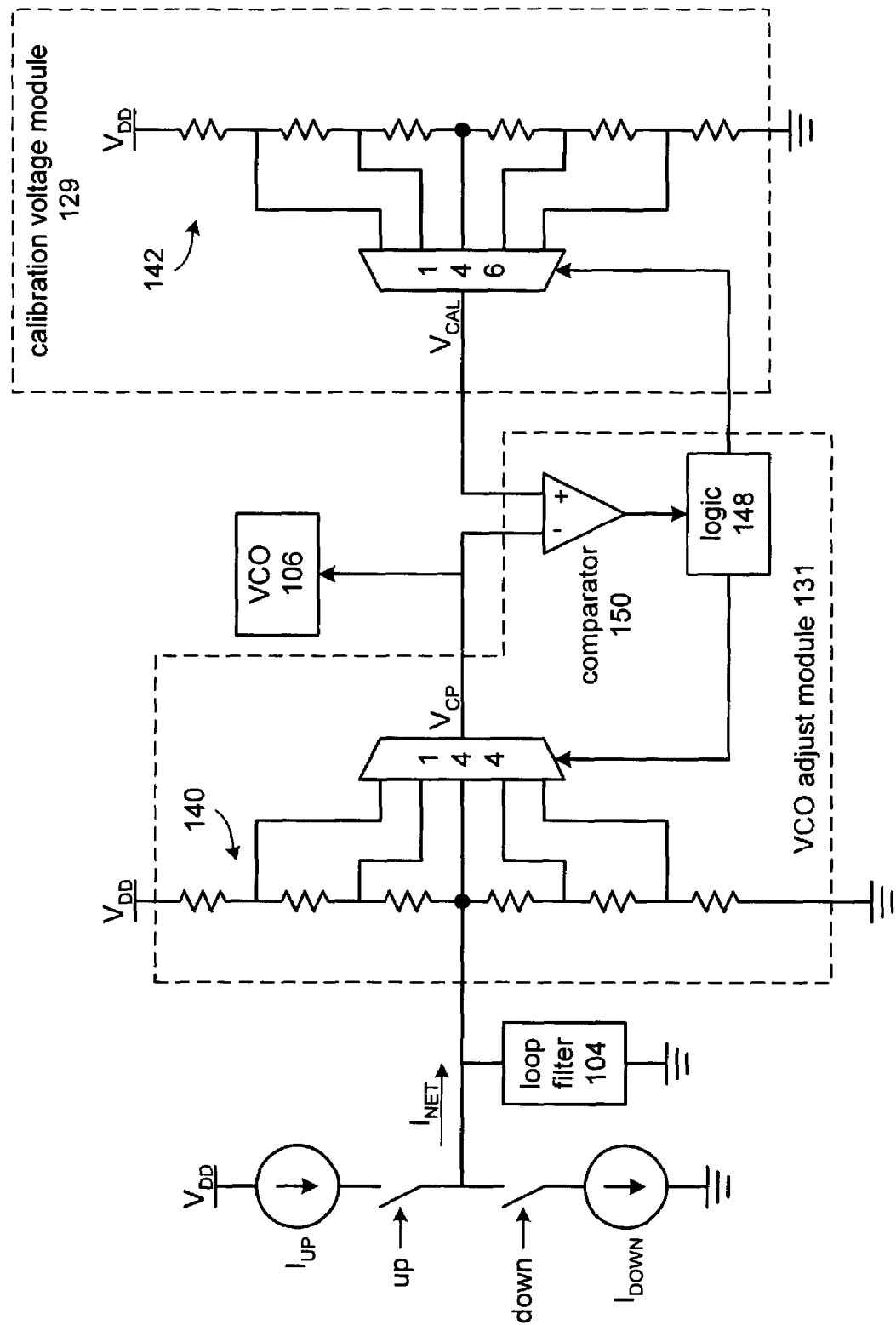
FIG. 7 is a more detailed schematic block diagram of a portion of the local oscillation module in accordance with the present invention.

FIG. 7 is a schematic block diagram illustrating the charge pump 102, loop filter 104, VCO 106, VCO adjust module 131 and calibration voltage module 129. As shown, the calibration voltage module 129 includes a voltage divider 142 and a multiplexor 146. The VCO adjust module 131 includes a voltage divider 140, multiplexor 144, comparator 150 and logic circuitry 148.

In calibration mode, the up and down switches are closed within the charge pump 102 such that the up and down currents are both simultaneously being generated. The resistive divider 140 is established such that if the net current ($I_{NET}$) is zero, the center tap of the resistive divider will be ½ $V_{DD}$. If the net current deviates from zero, the voltage at the center tap of the resistive divider 140 will change. Note that during calibration mode, the logic 148 selects the center tap, or other node, of resistive divider 140 via multiplexor 144.

During calibration mode, the calibration voltage module 129 selects one of its reference voltages via the control signal provided by logic 148 and outputted via multiplexor 146. For example, assume that the net current is zero such that $V_{CP}$ during calibration mode is ½ $V_{DD}$. The initial setting for the outputting of multiplexor 146 may be to output the center tap voltage, which corresponds to ½ $V_{DD}$. In this instance, the comparator would compare the two voltages, determine that they are identical, and the comparison output would be processed by logic 148. The processing performed by logic 148 would cause multiplexor 144 to output the center tap voltage of divider 140 during normal mode operations since this voltage corresponds to the intersection of the up and down currents.

Continuing with the example, if the net current is positive (i.e., the up current is greater than the down current), the voltage at the center tap of divider 140 will be greater than ½ $V_{DD}$. The logic 148 sequentially selects the various reference voltages produced by divider 142 and has each reference voltage compared with the $V_{CP}$ voltage. Once the reference calibration voltage approximately equals the measured $V_{CP}$ voltage, the logic 148 determines the appropriate resistor output voltage of divider 140 to output as the control voltage during normal mode. In this example, the logic 148 may select the output of the resistor just above the center tap to compensate for the up current being greater than the down current, such that, while, $V_{CP}$ is above ½ $V_{DD}$, the selected resistive divider output effectively scales the actual $V_{CP}$ to approximate ½ $V_{DD}$. In other words, the control voltage to the VCO 106 is adjusted, via adjustable capacitors, to correspond to the intersection of the up current and the down current.

As such, the calibration voltage module 129 determines the effective offset due to mismatches between the up and down currents in charge pump 102. Based on this determined offset, logic 148 selects one of the outputs of divider 140 to function as the control voltage thereby compensating for the differences in the up and down currents. As one of average skill in the art will appreciate, more or less taps of divider 140 and 142 may be included to obtain finer tuning of the control voltage or more coarse tuning of the reference voltage. As one of average skill in the art will further appreciate, the voltage calibration module 129 may be omitted and the VCO adjust module 131 may sequentially select between the various divider output taps while running the phase locked loop open (i.e., disconnecting the phase and frequency detection from the charge pump) to determine if the reference oscillation substantially matches the feedback oscillation. The tap position of divider 140 that more closely produces the feedback oscillation to match the reference oscillation is the desired setting for normal mode.

FIG. 8 is a logic diagram of a method for calibrating a phase locked loop, which may be used in a local oscillator of a radio frequency integrated circuit. The process begins at Step 160 where an intersection of an up current and a down current is determined. The process then proceeds to Step 162 where a reference voltage that corresponds to the intersection is determined. The process then proceeds to Step 164 where a control voltage provided to the voltage control oscillator of the phase locked loop is offset based on the reference voltage.

The offsetting of the control voltage as described in Step 164 may be further described with reference to FIG. 9. At Step 166, an input voltage of the VCO is set to a reference voltage. The process then proceeds to Step 168 where the reference oscillation is compared with a divided representation of the output oscillation. The process then proceeds to Step 170 where determination is made as to whether the comparison was unfavorable. If not, the process proceeds to Step 172 where no adjustment to the control voltage of the VCO is required. If, however, the comparison was unfavorable, the process proceeds to Step 174 where the control voltage of the VCO is adjusted such that the feedback oscillation more closely approximates the reference oscillation. This was described generally with reference to FIG. 7.

FIG. 10 illustrates the determining of an intersection of the up and down currents as described in Step 160 of FIG. 8. At Step 176, the charge pump is enabled to simultaneously generate the up current and down current. The process then proceeds to Step 178 where a net current is established based on the difference between the up current and the down current. The process then proceeds to Step 180 where the reference voltage is established based on the net current.

The preceding discussion has presented a method and apparatus for calibrating a phase locked loop that may be used in a local oscillator of a radio frequency integrated circuit. By calibrating the phase locked loop, its operation is more linear thus providing more linear operation of the radio frequency integrated circuit. As one of average skill in the art will appreciate, other embodiments may be derived from the teachings of the present invention, without deviating from the scope of the claims.

What is claimed is:

1. A method for calibrating a phase locked loop, the method comprises:
   determining an intersection of an up current and a down current, wherein a charge pump of the phase locked loop generates the up current and the down current and wherein the charge pump is enabled to simultaneously generate the up current and the down current;
   establishing a net current based on a difference between the up current and the down current;
   determining a reference voltage corresponding to the intersection based on the net current; and
   offsetting a control voltage of a voltage control oscillator of the phase locked loop based on the reference voltage, wherein the voltage control oscillator produces an output oscillation.

2. The method of claim 1, wherein the determining the intersection of the up and down currents further comprises: comparing a reference oscillation with a divided representation of the output oscillation; and
   when the comparing of the reference oscillation with the divided representation of the output oscillation is unfavorable, adjusting oscillation of the voltage control oscillator such that the divided representation of the output oscillation more closely approximates the reference oscillation.

3. The method of claim 1, wherein the enabling the charge pump further comprises:
   enabling the charge pump to simultaneously generate the up current and the down current for a short duration to compensate for dynamic mismatches within the charge pump.

4. The method of claim 1, wherein the establishing the reference voltage based on the net current further comprises:
   converting the net current into a first voltage;
   comparing the first voltage with a plurality of reference voltages; and
   determining the reference voltage as the voltage of the plurality of reference voltages that most closely approximates the first voltage.

5. A phase locked loop comprising:
   a phase and frequency detection module operably coupled to produce a charge up signal when at least one of phase and frequency of a reference oscillation leads at least one of phase and frequency of a feedback oscillation, to produce a charge down signal when the at least one of phase and frequency of the reference oscillation lags the at least one of phase and frequency of the feedback oscillation;
   a charge pump operably coupled to produce a positive current in response to the charge up signal and a negative current in response to the charge down signal;
   loop filter operably coupled to convert the positive and negative currents into a control voltage;
   voltage controlled oscillator operably coupled to produce an output oscillation based on the control voltage or a calibration voltage;
   calibration module operably coupled to provide the calibration voltage to the voltage controlled oscillator when the phase locked loop is in calibration mode and to provide the control voltage to the voltage controlled oscillator when the phase locked loop is in normal mode, wherein the calibration module includes:
      calibration voltage module operably coupled to produce the calibration voltage based on an intersection of the positive current with the negative current when the phase locked loop is in the calibration mode; and
      voltage controlled oscillator adjust module operably coupled to adjust oscillation of the voltage controlled oscillator by adjusting the control voltage based on the calibration voltage;
   divider module operably coupled to divide the output oscillation by a divider value to produce the feedback oscillation.

6. The phase locked loop of claim 5, wherein the voltage controlled oscillator adjust module and the voltage controlled oscillator adjust module further comprises:
   means for adjusting oscillation of the voltage control oscillator such that the feedback oscillation more closely approximates the reference oscillation when the comparing of the reference oscillation with the feedback oscillation via the phase and frequency detection module is unfavorable.

7. The phase locked loop of claim 6, wherein the calibration voltage module and the voltage controlled oscillator adjust module further comprises:
   means for determining an intersection of the up current and the down current;
   means for determining a reference voltage corresponding to the intersection; and
   means for offsetting a control voltage of the voltage control oscillator based on the reference voltage.

8. The phase locked loop of claim 7, wherein the means for determining the intersection further comprises:
   means for enabling the charge pump to simultaneously generate the up current and the down current;
   means for establishing a net current based on a difference between the up current and the down current; and means for establishing the reference voltage based on the net current.

9. The phase locked loop of claim 8, wherein the means for enabling the charge pump further comprises:
means for enabling the charge pump to simultaneously generate the up current and the down current for a short duration to compensate for dynamic mismatches within the charge pump.

10. The phase locked loop of claim 8, wherein the means for establishing the reference voltage based on the net current further comprises:
means for converting the net current into a first voltage;
means for comparing the first voltage with a plurality of reference voltages; and
means for determining the reference voltage as the voltage of the plurality of reference voltages that most closely approximates the first voltage.

11. A radio frequency integrated circuit (RFIC) comprises:
transmitter section operably coupled to convert outbound data into outbound radio frequency (RF) signals based on a transmitter local oscillation;
receiver section operably coupled to convert inbound RF signals into inbound data based on a receiver local oscillation; and
a local oscillation module operably coupled to produce the transmitter local oscillation and the receiver local oscillation, wherein the local oscillation module includes:
a phase and frequency detection module operably coupled to produce a charge up signal when at least one of phase and frequency of a reference oscillation leads at least one of phase and frequency of a feedback oscillation, to produce a charge down signal when the at least one of phase and frequency of the reference oscillation lags the at least one of phase and frequency of the feedback oscillation;
a charge pump operably coupled to produce a positive current in response to the charge up signal and a negative current in response to the charge down signal;
loop filter operably coupled to convert the positive and negative currents into a control voltage;
voltage controlled oscillator operably coupled to produce an output oscillation based on the control voltage or a calibration voltage, wherein the transmitter local oscillation and the receiver local oscillation are derived from the output oscillation;
calibration module operably coupled to provide the calibration voltage to the voltage controlled oscillator when the phase locked loop is in calibration mode and to provide the control voltage to the voltage controlled oscillator when the phase locked loop is in normal mode, wherein the calibration module includes:
calibration voltage module operably coupled to produce the calibration voltage based on an intersection of the positive current with the negative current when the phase locked loop is in the calibration mode; and
voltage controlled oscillator adjust module operably coupled to adjust oscillation of the voltage controlled oscillator by adjusting the control voltage based on the calibration voltage;
divider module operably coupled to divide the output oscillation by a divider value to produce the feedback oscillation.

12. The REIC of claim 11, wherein the voltage controlled oscillator adjust module further comprises:
means for adjusting oscillation of the voltage control oscillator such that the feedback oscillation more closely approximates the reference oscillation when the comparing of the reference oscillation with the feedback oscillation via the phase and frequency detection module is unfavorable.

13. The RFIC of claim 11, wherein the calibration voltage module and the voltage controlled oscillator adjust module further comprise:
means for determining an intersection of the up current and the down current;
means for determining a reference voltage corresponding to the intersection;
means for offsetting a control voltage of the voltage control oscillator based on the reference voltage.

14. The RFIC of claim 13, wherein the means for determining the intersection further comprises:
means for enabling the charge pump to simultaneously generate the up current and the down current;
means for establishing a net current based on a difference between the up current and the down current; and
means for establishing the reference voltage based on the net current.

15. The RFIC of claim 14, wherein the means for enabling the charge pump further comprises:
means for enabling the charge pump to simultaneously generate the up current and the down current for a short duration to compensate for dynamic mismatches within the charge pump.

16. The RFIC of claim 14, wherein the means for establishing the reference voltage based on the net current further comprises:
means for converting the net current into a first voltage;
means for comparing the first voltage with a plurality of reference voltages; and
means for determining the reference voltage as the voltage of the plurality of reference voltages that most closely approximates the first voltage.

* * * * *